United States Patent [19]

Rohrer

[11] 3,939,292

[45] Feb. 17, 1976

[54] PROCESS FOR STABLE PHASE III POTASSIUM NITRATE AND ARTICLES PREPARED THEREFROM

[75] Inventor: George A. Rohrer, Sault St. Marie, Mich.

[73] Assignee: Technovation, Inc., Sault Ste. Marie, Mich.

[22] Filed: Dec. 18, 1972

[21] Appl. No.: 316,417

Related U.S. Application Data

[63] Continuation-in-part of Ser. No. 76,059, Sept. 28, 1970, Pat. No. 3,728,694.

[52] U.S. Cl. .................. 427/55; 427/100; 427/126; 427/248
[51] Int. Cl.² .......................................... B05D 3/06
[58] Field of Search........ 117/106 R, 201, 217, 219, 117/223, 212; 423/395; 427/58, 81, 100, 248, 55

[56] References Cited
UNITED STATES PATENTS 2,922,730   1/1960   Feldman ............................ 117/217
3,405,440   10/1968   Nolta et al. ........................... 29/604

OTHER PUBLICATIONS

Nolta et al., *Dielectric Behavior of Films of Vacuum–Deposited Potassium Nitrate*, In Chemical Abstracts, 71:106543k. 1969.

*Primary Examiner*—Cameron K. Weiffenbach
*Attorney, Agent, or Firm*—Irving M. Weiner

[57] ABSTRACT

A ferroelectric Phase III potassium nitrate ($KNO_3$) which is stable at ambient temperatures is produced in accordance herewith by crystallizing reagent grade $KNO_3$ under vacuum and heat and, then, equilibrating the resultant to ambient conditions. This stable Phase III $KNO_3$ which is of crystalline structure exhibits visual and optical effects when subjected to mechanical and electrical alteration of the polarization vector of the crystalline structure, thus, rendering it useful in the manufacture of transparent electrodes by interposing this crystalline material between the electrodes, and the like. Furthermore, ferroelectric thin film memory arrays can be produced herefrom.

6 Claims, No Drawings

PROCESS FOR STABLE PHASE III POTASSIUM NITRATE AND ARTICLES PREPARED THEREFROM

CROSS-REFERENCE TO RELATED APPLICATIONS

This application is a continuation-in-part application of copending U.S. Patent application Ser. No. 76,059, filed Sept. 28, 1970 and entitled FERROELECTRIC DEVICE AND PROCESS OF MANUFACTURING SAME, now U.S. Pat. No. 3,728,694.

BACKGROUND OF THE INVENTION

1. Field of the Invention

The present invention pertains to compositions of matter which exhibit ferroelectric properties and to products produced therefrom. More particularly, the present invention pertains to processes for the manufacture of certain compositions of matter which exhibit ferroelectric properties and to processes for the manufacture of articles therefrom. Even more particularly, the present invention concerns a process for the manufacture of a stable Phase III potassium nitrate and article prepared therefrom.

2. Prior Art

There has heretofore been developed a plurality of proprietary compositions which exhibit light transmission phenomena, i.e., are capable of polarizing light, and which are deployed in the manufacture of transparent electrodes and the like. The electrodes are, generally, indium oxide and tin oxide based compositions which serve as means for electrically contacting the polarizing crystal while still permitting light to pass. However, none of these compounds exhibit ferroelectric properties, in the sense of being useful in the manufacture of thin film memory devices.

On the other hand there has been developed a plurality of thin film memory device compositions, e.g. barium titanate, lead zerconate compounds which, although, they can be deployed as an optical or light polarizing medium, suffer certain inherent drawbacks. Generally, these compounds are grown crystals which must be processed down to about a ten mils thickness and, therefore, are not suitable for batch process manufacture. Moreover, the prior art devices require a high voltage to polarize the light passing through them. Furthermore, the switching or polarizing response time is fairly slow.

It has been found, as detailed subsequently, that thin films of stable Phase III potassium nitrate exhibit both such properties.

Thus, the present invention provides a composition which is ferroelectric and which exhibits such light transferring phenomena.

SUMMARY OF THE INVENTION

In accordance with one aspect of the present invention a stable Phase III potassium nitrate ($KNO_3$) is provided by a process which generally comprises evaporating, under heat and vacuum, reagent grade $KNO_3$, collecting the vapors as a crystalline thin film, and, then, relieving the vacuum and cooling the crystallized product to room temperature.

In accordance with another aspect of the present invention, there is provided a stable Phase III potassium nitrate which exhibits optical or light transferring properties.

The present invention further provides the deployment of the stable Phase III potassium nitrate as a ferroelectric thin film memory device, as a light polarization medium, and similar articles of manufacture.

For a more complete understanding of the present invention reference is made to the following detailed description and examples thereof.

DESCRIPTION OF THE PREFERRED EMBODIMENTS

In the above-referred to copending application, the disclosure of which is hereby incorporated by reference, there is disclosed a thin film ferroelectric memory device for use in binary systems, i.e., computers and the like, and a process therefor. The device essentially comprises a layer of stable Phase III potassium nitrate having a thickness not in excess of 110 microns and a pair of electrodes leading from the thin film layer.

It was discovered in accordance with the copending application that such ferroelectric devices produced an unexpected result in that the devices prepared therefrom exhibited no "waiting" effect, a distinct advantage over prior art ferroelectric devices. The unobvious result achieved in the copending application was attributable to the formation of a crystalline thin film of Phase III potassium nitrate, since similar devices prepared from "bulk" Phase III potassium nitrate do exhibit a "waiting time" and are unstable under ambient conditions, i.e., room temperature and pressure, over an extended period of time.

Now in accordance with one aspect of the present invention it has unexpectedly been found that stable Phase III potassium nitrate can be produced and which has associated therewith optical or light transferring phenomena. Although some heretofore known ferroelectric materials have been known to exhibit optical properties the present discovery was unexpected since bulk Phase III potassium nitrate is not stable and does not, therefore, exhibit repetitive effects except over a very limited temperature and pressure range, but which is not effective at atmospheric conditions.

The manufacture of Phase III potassium nitrate is known. See, inter alia, U.S. Pat. No. 3,405,440. However, according to this patent it is incumbent that a rapid quenching process step be employed. Contrary to the reference, it has been found that a quenching step is not required in the production of stable thin films of Phase III potassium nitrate.

Thus, the potassium nitrate of the present invention is produced by a process which generally comprises:

a. melting reagent grade potassium nitrate in the presence of heat and a high vacuum, b. evaporating the melted potassium nitrate, c. collecting the evaporated $KNO_3$ in the form of a thin film and, then, d. relieving the vacuum to provide Phase III potassium nitrate which is stable at ambient conditions.

More particularly, the process contemplated herein comprises placing reagent grade potassium nitrate in a suitable vessel disposed in an evacuated chamber and subjecting the reagent grade potassium nitrate to an elevated temperature sufficient to melt it. Generally, a temperature of at least about 334° C will be sufficient to melt the $KNO_3$, and should range from about 350° C to 450° C, and preferably, from about 350° C to 380° C. In the evacuated chamber melting will generally be achieved in about three to five minutes and usually in a maximum time of about one hour. The purpose of melting the potassium nitrate in a vacuum is to expunge all traces of moisture therefrom.

In order to carry out the process efficiently, a high vacuum must be maintained. Generally, a maximum pressure of about $1 \times 10^{-5}$ torr is allowable. A pressure ranging from about $6 \times 10^{-6}$ torr to about $2 \times 10^{-7}$ torr is preferred. Lower pressures can be utilized and the lowest possible pressure which can be employed is dictated solely by available equipment.

While maintaining the vacuum, the melted potassium nitrate, expunged of any moisture, is then evaporated. Evaporation of the potassium nitrate can be achieved over a temperature ranging from about 390° C to 440° C, and preferably at a temperature of from about 400° C to 405° C. The so-produced vapors of potassium are then collected as a thin film thereof.

The term "a thin film" as used herein means a layer of crystalline potassium nitrate having a maximum thickness of about 110 microns. Moreover, it is incumbent hereto that only the vapors of potassium nitrate be collected. It has been found that as the vapors collect they nucleate and form the crystalline thin film. Generally, collecting the vapors over a time period of from about two to four minutes will be sufficient to form a thin film having the prerequisite properties. The vapors of potassium nitrate are collected, by reducing the temperature to below about 25° C, on any suitable collecting medium, and in the instance of manufacturing an article on any suitable substrate, such as, a silica substrate for the manufacture of a ferroelectric device; for preparing a transparent electrode and the like. The lowering of the temperature in the chamber can be achieved in a multiplicity of ways, but it is preferred to have the collecting medium at a lower temperature than the vapors such that in effect, a condensation of the vapors is achieved thereon. It is these condensed vapors which nucleate and grow into the crystalline thin film.

After the potassium nitrate is collected, as the crystalline thin film, the vacuum is relieved and the temperature is allowed to restore to room temperature. The resulting product is a thin film of Phase III potassium nitrate which is stable at ambient conditions.

In a particularly preferred article prepared herefrom and in accordance with another aspect of the present invention the present thin films of Phase III potassium nitrate are used to prepare ferroelectric memory devices, such devices being disclosed and claimed in the above-referred to copending application.

In preparing such a device a silica substrate, i.e., glass, is employed. To prepare the device a vacuum of the magnitude hereinbefore defined is utilized. Thus, the manufacture of the electrode can be integrated into the process for preparing the thin film potassium nitrate.

Thus, under vacuum the substrate is heated to a temperature of about 100° C. A few grams of high purity silver or other suitable electrode material, in a vapor state, elevated to approximately 1200° C, by resistance heating, is deposited on the substrate, as the lower electrode thereof.

Thickness of the lower electrode is not too critical, but should not be so thick that it peels from the substrate. Because the grain size of the silver is a function of several parameters including thickness and because hetero epitaxy may play an important role in the orientation of the potassium nitrate deposition, the thickness and the electrode material may be important.

Although a variety of other materials can be used, silver is preferred for the lower electrode because of its good thin film conductivity, ease of evaporation, and its relative inertness to potassium nitrate vapor.

When the desired thickness of the lower electrode is achieved deposition of the vapors is ceased.

It is this silver-deposited silica substrate which is then deployed as the collecting medium for the potassium nitrate vapors produced in accordance herewith. After the deposition is completed the vacuum is relieved with dry nitrogen gas to one atmosphere and remains thereat for about fifteen minutes to allow complete conversion of the potassium nitrate nucleate to Phase III.

Thereafter, the vacuum is re-applied and at elevated temperatures the upper electrode is deposited over the thin film layer of potassium nitrate. A suitable upper electrode material is aluminum which is deposited as vapors thereof at a temperature of about 1000° C. After the deposition is achieved the vacuum and temperature are relieved and the so-produced product is allowed to reach ambient conditions.

For a more comprehensive discussion of the preparation of the thin film memory device reference is made to the above-referred to copending application.

It is apparent from the preceding that by a proper selection of the substrate a variety of products other than the ferroelectric memory device can be produced. These other products can be deployed in optical memory systems, optical display devices, high speed shutter for photographic systems, holographic systems and the like.

For a more complete understanding of the present invention, reference is made to the following illustrative and non-limitative following examples. In the examples, all parts are by weight absent indications to the contrary.

EXAMPLE I

This example illustrates the preparation of a Phase III potassium nitrate thin film in accordance with the instant invention.

Into a moisture-free evacuated chamber, equipped with a cold trap, vacuum pump, cooling coils and heating means, and maintained at a pressure of $6 \times 10^{-6}$ torr is placed a tantalum crucible containing a quantity of powdered reagent grade potassium nitrate. While maintaining the vacuum, the crucible is slowly heated to about 400° C for about thirty minutes to completely melt the powder and to release any moisture therefrom, the moisture is removed from the system by the cold trap.

After the potassium nitrate is melted, the temperature of the crucible is slowly elevated to about 405° C and is maintained thereat for about five minutes to evaporate the melted potassium nitrate.

The vapors are then collected at a deposition or collection rate of about 20 to 30 angstroms per minute.

As the vapors are collected they begin to nucleate and grow into an oriented crystalline thin film which is Phase III potassium nitrate.

The vacuum is then relieved to allow the chamber to return to atmospheric pressure, with the cold trap keeping water vapors out, and the temperature in the chamber is allowed to reach room temperature.

The physical equipment used to prepare the stable Phase III potassium nitrate is more particularly described in the above-identified copending application.

In this example a silica substrate is employed to collect the vapors and, in particular, a laboratory slide glass. The thickness of the thin film is about 650A to 750A.

To evidence the optical properties of this thin film, the so-produced item is placed under a polarizing microscope which is adjusted for dark field microscopy to orient the properly aligned crystals of the film as dark spots. With an applied electric field the analyzer is then rotated between 5 to 20 degrees of rotation and the heretofore dark spots become bright. Thus, under electrical influences the polarization vector of the film changes. Repetition of this analysis over a nine-month period of time provides the same results.

EXAMPLE II

Using the same equipment as in Example I, a thin film of Phase III potassium nitrate is prepared.

In this example the pressure in the chamber is maintained at $2 \times 10^{-6}$ torr and the powdered reagent grade potassium nitrate is melted at 350° C. The evaporation of the melted powder is effected at about 380° C. Using the same substrate and rate of deposition the same results as in Example I are realized.

When bulk Phase III potassium nitrate is used in lieu of the thin film, optical analysis at atmospheric conditions shows no polarizing. Thus, bulk Phase III is shown not to be synonymous with film Phase III potassium nitrate at ambient conditions.

I claim:

1. A process for the preparation of a Phase III potassium nitrate which is stable at ambient conditions, comprising:
    a. melting reagent grade potassium nitrate in the presence of a vacuum having a maximum pressure of about $1 \times 10^{-5}$ torr,
    b. evaporating the melted potassium nitrate at a temperature of from about 390° C to 440° C while maintaining the vacuum,
    c. collecting the vapors in the form of a thin film of Phase III potassium nitrate, and
    d. relieving the vacuum to atmospheric pressure and allowing the temperature to reach room temperature while maintaining a moisture-free atmosphere.

2. The process of claim 1 wherein the reagent grade potassium nitrate is melted at a temperature of from about 334° C to 450° C.

3. A process of manufacturing a ferroelectric device comprising the steps of:
    forming a first electrical contact;
    forming, by vapor deposition performed in a vacuum at a pressure no greater than $1 \times 10^{-5}$ torr and at a temperature of from about 390° C to 440° C, a stable thin film of potassium nitrate over at least a portion of said first electrical contact;
    relieving said vacuum to a pressure of approximately one atmosphere with a dry predetermined gas for a predetermined period of time;
    reapplying said vacuum; and
    forming a second electrical contact over at least a portion of said stable thin film of potassium nitrate.

4. A process of manufacturing a ferroelectric device characterized in accordance with claim 3, wherein said first-mentioned vacuum is relieved to a pressure of approximately one atmosphere with cold dry nitrogen gas.

5. A process of manufacturing a ferroelectric device characterized in accordance with claim 3, wherein prior to forming said film of potassium nitrate over said first electrical contact, the potassium nitrate is converted from powder form to liquid form by slowly increasing the temperature for a period of time less than one hour.

6. A process of manufacturing a ferroelectric device characterized in accordance with claim 5, wherein said conversion of potassium nitrate from powder form to liquid form is accomplished by radiation heating.

* * * * *